US012336161B2

United States Patent
Liu (10) Patent No.: US 12,336,161 B2
(45) Date of Patent: Jun. 17, 2025

(54) SEMICONDUCTOR STRUCTURE AND MANUFACTURING METHOD THEREOF

(71) Applicant: CHANGXIN MEMORY TECHNOLOGIES, INC., Anhui (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 391 days.

(21) Appl. No.: 17/830,618

(22) Filed: Jun. 2, 2022

(65) Prior Publication Data

US 2023/0091786 A1 Mar. 23, 2023

Related U.S. Application Data (63) Continuation of application No. PCT/CN2022/070324, filed on Jan. 5, 2022.

(30) Foreign Application Priority Data

Sep. 17, 2021 (CN) .......................... 202111094836.9

(51) Int. Cl.
| | |
|---|---|
| H01L 27/11 | (2006.01) |
| H01L 21/3213 | (2006.01) |
| H01L 23/522 | (2006.01) |
| H10B 10/00 | (2023.01) |

(52) U.S. Cl.
CPC ....... H10B 10/18 (2023.02); H01L 21/32139 (2013.01); H01L 23/5223 (2013.01)

(58) Field of Classification Search
CPC ......... H01L 21/76831; H01L 21/76895; H01L 21/32139; H10B 10/18
See application file for complete search history.

(56) References Cited

U.S. PATENT DOCUMENTS

| | | | |
|---|---|---|---|
| 8,890,247 B2 | 11/2014 | Bedell | |
| 11,049,863 B2* | 6/2021 | Feng | ...................... H10B 12/01 |
| 11,233,061 B2 | 1/2022 | Zhou | |
| 2014/0103436 A1 | 4/2014 | Bedell et al. | |
| 2020/0075604 A1 | 3/2020 | Zhou | |
| 2020/0365537 A1 | 11/2020 | Choi et al. | |

FOREIGN PATENT DOCUMENTS

| | | | |
|---|---|---|---|
| CN | 103730403 A | 4/2014 | |
| CN | 104752432 A | 7/2015 | |
| CN | 110875320 A | 3/2020 | |
| CN | 108511440 B | 12/2020 | |
| JP | 2007158004 A | 6/2007 | |

* cited by examiner

*Primary Examiner* — Walter H Swanson
(74) *Attorney, Agent, or Firm* — Kilpatrick Townsend & Stockton LLP (57) ABSTRACT

A semiconductor structure includes: a substrate; a gate structure on the substrate; and an interconnect structure including a first interconnect sub-structure and a second interconnect sub-structure, where the second interconnect sub-structure protrudes from the first interconnect sub-structure. The first interconnect sub-structure is connected with the substrate, and the second interconnect sub-structure is connected with a top of the gate structure.

8 Claims, 8 Drawing Sheets

SEMICONDUCTOR STRUCTURE AND MANUFACTURING METHOD THEREOF

CROSS REFERENCE TO RELATED APPLICATIONS

This application is a continuation of International Application No. PCT/CN2022/070324, filed on Jan. 5, 2022, which claims priority to Chinese Patent Application No. 202111094836.9, filed on Sep. 17, 2021. The disclosures of International Application No. PCT/CN2022/070324 and Chinese Patent Application No. 202111094836.9 are hereby incorporated by reference in their entireties.

TECHNICAL FIELD

Embodiments of the present disclosure relate to a semiconductor structure and a manufacturing method of a semiconductor structure, and specifically, to a semiconductor structure with an interconnect structure and a manufacturing method thereof.

BACKGROUND

An existing Dynamic Random Access Memory (DRAM) includes memory cells and peripheral control devices. With the advancement of the semiconductor manufacturing technology, critical dimensions defined in design specifications of semiconductor components become increasingly small, and the difficulty of manufacturing peripheral control devices is increased.

SUMMARY

The embodiments of the present disclosure are intended to provide a semiconductor structure and a manufacturing method thereof. Through the design of an interconnect structure connected to a substrate and a gate structure, the volume occupied by an interconnect structure can be reduced, the density of the interconnect structures can be increased, and a process window of the interconnect structure can be improved.

According to a first aspect, an embodiment of the present disclosure provides a semiconductor structure, including: a substrate; a gate structure on the substrate; and an interconnect structure including a first interconnect sub-structure and a second interconnect sub-structure, where the second interconnect sub-structure protrudes from the first interconnect sub-structure. The first interconnect sub-structure is connected with the substrate, and the second interconnect sub-structure is connected with a top of the gate structure.

According to a second aspect, an embodiment of the present disclosure provides a manufacturing method of a semiconductor structure, including: a substrate is provided; a gate structure and a first dielectric layer are formed on the substrate, where the first dielectric layer covers the gate structure; a first opening is formed in the first dielectric layer, where a part of the substrate and at least part of a top of the gate structure are exposed from the first opening; and an interconnect structure is formed in the first opening. The interconnect structure includes a first interconnect sub-structure and a second interconnect sub-structure, the first interconnect sub-structure is connected with the substrate, and the second interconnect sub-structure is connected with the top of the gate structure.

BRIEF DESCRIPTION OF THE DRAWINGS

In the drawings, unless stated otherwise, the same reference numbers refer to same or similar parts or elements throughout the drawings. The drawings are not necessarily drawn to scale. It should be understood that these drawings depict only some implementations disclosed in accordance with the embodiments of the present disclosure, and it should not be construed as limiting a scope of the embodiments of the present disclosure.

DETAILED DESCRIPTION

In order to make the purposes, technical solutions and advantages of the embodiments of the present disclosure more clear, embodiments of the present disclosure will be described in further detail below in conjunction with specific embodiments and with reference to the accompanying drawings. It should be understood that these descriptions are exemplary only, these descriptions are not intended to limit a scope of the disclosed embodiments. Furthermore, in the following description, descriptions of well-known structures and techniques are omitted to avoid unnecessarily obscuring the concepts of the embodiments of the present disclosure.

Obviously, the described embodiments are only a part of the embodiments of the present disclosure, but not all the embodiments. All other embodiments obtained by those skilled in the art based on one or more embodiments of the disclosure without creative efforts fall within the scope of protection of the present disclosure.

It should be understood that terms "first", "second" or the like in the embodiments of the present disclosure may be used to describe various elements, but these elements should not be limited by these terms. These terms are only used to distinguish one element from another. For example, a first element could be referred to as a second element, and similarly, a second element could be referred to as a first element, without departing from the scope of embodiments of the present disclosure.

Figure 1:
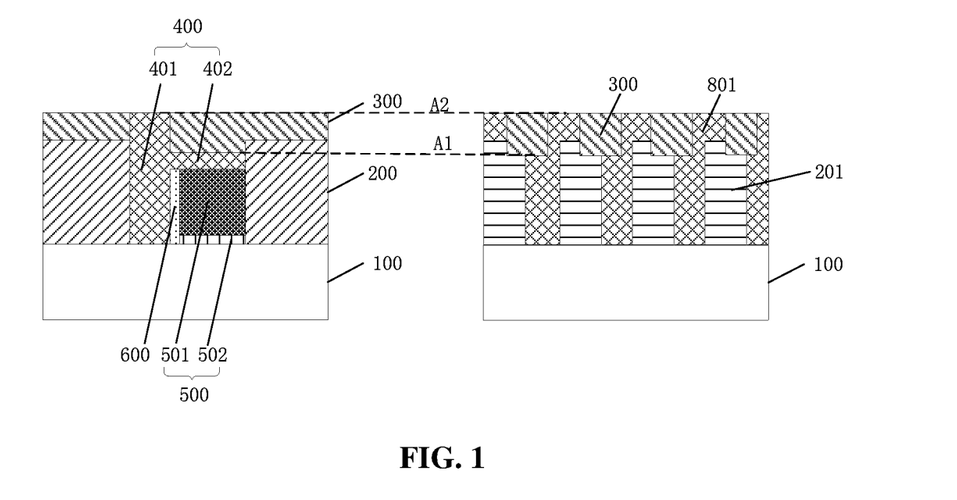
FIG. 1 is a schematic structural diagram of a peripheral region (left half) and a memory region (right half) of a semiconductor structure according to an embodiment of the present disclosure.
Figure 2:
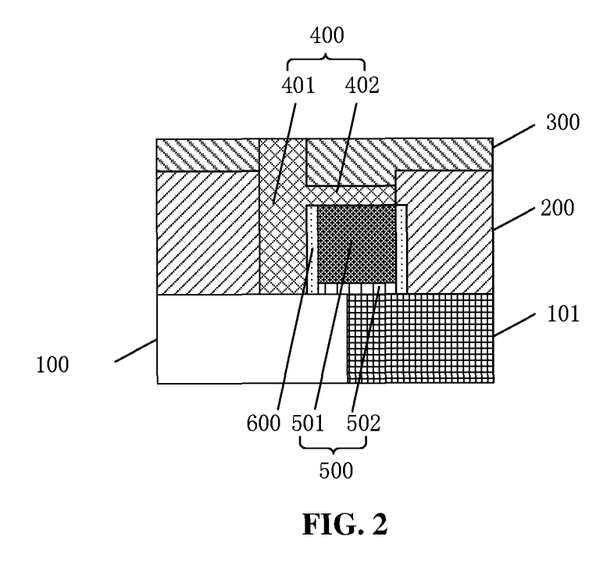
FIG. 2 is a schematic structural diagram of a peripheral region of the semiconductor structure according to another embodiment of the present disclosure.
Figure 3:
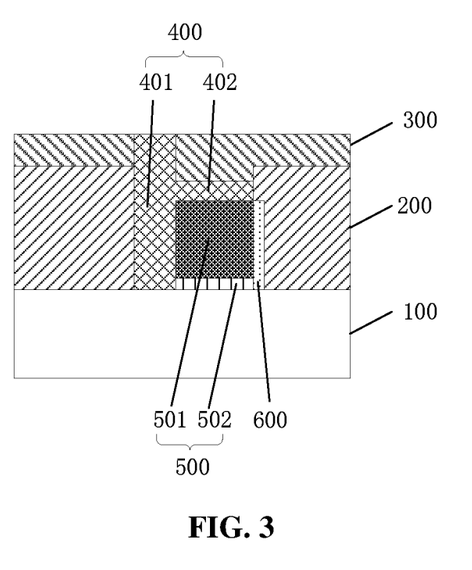
FIG. 3 is a schematic structural diagram of a peripheral region of the semiconductor structure according to yet another embodiment of the present disclosure.

The embodiments of the present disclosure will be described in detail below with reference to the accompanying drawings. According to an embodiment of the present disclosure, a semiconductor structure is provided, and schematic structural diagrams of the semiconductor structure are shown in FIG. 1 to FIG. 3. In an embodiment, referring to the left half of FIG. 1, a semiconductor structure includes a substrate 100 and a gate structure 500 disposed on the substrate 100. The semiconductor structure may also include an interconnect structure 400; and the interconnect structure 400 includes a first interconnect sub-structure 401 and a second interconnect sub-structure 402, and the second interconnect sub-structure 402 protrudes from the first interconnect sub-structure 401. The first interconnect sub-structure 401 is connected with the substrate 100, and the second interconnect sub-structure 402 is connected with a top of the gate structure 500.

In some embodiments, the substrate 100 includes semiconductor substrates, such as silicon substrate, gallium arsenide substrate, gallium nitride substrate, gallium carbide substrate, Silicon-On-Insulator (SOI) substrate, or the like. Taking the structure of a DRAM chip as an example, the chip may include a memory region and a peripheral region. The left half of FIG. 1 can be a device structure on the peripheral region, For example, the device structure on the peripheral region may include the gate structure 500 and the interconnect structure 400. The right half of FIG. 1 can be a device structure on the memory region. The device structures on the memory regions may include capacitor contact pads 801, and the capacitor contact pads 801 may be electrically connected to the substrate 100. In other examples, the capacitor contact pads 801 may also be electrically connected to the substrate 100 through polysilicon plugs.

In some embodiments, the gate structure 500 may include a gate dielectric layer 502 and a gate electrode layer 501, where the gate dielectric layer 502 is in direct contact with the substrate 100, and the gate electrode layer 501 is disposed on the gate dielectric layer 502. The first interconnect sub-structure 401 is in direct contact with a surface of the gate electrode layer 501, and the second interconnect sub-structure 402 is in direct contact with a top surface of the gate electrode layer 501. Exemplarily, the gate dielectric layer 502 may include one or a combination of silicon oxide and silicon oxynitride, and may also include high-k materials such as hafnium oxide. The gate electrode layer 501 may include any one or any combination of conductive materials such as polysilicon, titanium nitride, tungsten, and aluminum. The material of the first interconnect sub-structure 401 can be a metal such as tungsten or cobalt. The material of the second interconnect sub-structure 402 may be a metal such as tungsten or cobalt. The materials of the first interconnect sub-structure 401 and the materials of the second interconnect sub-structure 402 may be same or may be different. Exemplarily, the first interconnect sub-structure 401 may be in direct contact with a side surface of the gate electrode layer 501 to form an electrical connection, and the second interconnect sub-structure 402 is in direct contact with the top surface of the gate electrode layer 501 to form an electrical connection.

In some embodiments, the substrate 100 may include an isolation structure 101. Referring to FIG. 2, a projection of the gate structure 500 on the substrate 100 at least partially covers the isolation structures 101. Exemplarily, the isolation structure 101 may be a Shallow Trench Isolation (STI) structure for isolating the active region. The gate structure 500 may be partially over the isolation structure 101.

In some embodiments, the semiconductor structure may also include a barrier layer, where the barrier layer covers at least a partial surface of the first interconnect sub-structure 401 and a partial surface of the second interconnect sub-structure 402. The material of the barrier layer can be one or a combination of titanium nitride and tantalum nitride.

In some embodiments, the semiconductor structure may further include a first dielectric layer 200. The first dielectric layer 200 is disposed on the substrate 100, the gate structure 500 and the interconnect structure 400 are disposed in the first dielectric layer 200, and a top surface of the second interconnect sub-structure 402 is lower than a top surface of the first dielectric layer 200. In this way, a distance between the second interconnect sub-structure 402 and its surrounding conductive connecting line can be reduced, the process window can be increased and the yield can be improved. Exemplarily, the first dielectric layer 200 may include any one of or any combination of a silicon oxide layer, a silicon nitride layer, a silicon oxynitride layer, or the like. For example, after the gate structure 500 is formed on the substrate 100, a silicon oxide layer may be formed on the substrate 100 by deposition methods such as chemical vapor deposition process, and the silicon oxide layer also covers the gate structure 500.

In some embodiments, the semiconductor structure may further include a second dielectric layer 300 disposed on the first dielectric layer 200 and covering the second interconnect sub-structure 402, where the top surface of the first interconnect sub-structure 401 is flush with the top surface of the second dielectric layer 300. Exemplarily, the second dielectric layer 300 may include any one of or any combination of a silicon oxide layer, a silicon nitride layer, a silicon oxynitride layer, or the like. For example, a silicon nitride layer may be formed on the first dielectric layer 200 and the interconnect structure 400 by deposition methods such as a chemical vapor deposition process, and the silicon nitride layer and the first interconnect sub-structure 401 may be grinded to a predetermined position by a chemical mechanical polishing process, so as to obtain a flat surface where the top surface of the first interconnect sub-structure 401 is flush with the top surface of the second dielectric layer 300.

In some embodiments, the semiconductor structure may further include an isolation layer 600, where the isolation layer 600 is disposed on a side surface of the gate structure 500 for protecting the gate structure 500. As shown in the left half of FIG. 1, the isolation layer 600 is disposed on one side surface of the gate structure 500, and the first interconnect sub-structure 401 is in direct contact with the isolation layer 600. In another example, as shown in FIG. 3, the isolation layer 600 may also be disposed on the other side surface of the gate structure 500, and the isolation layer 600 is in direct contact with the first dielectric layer 200. In other examples, the isolation layers 600 may also be disposed on two side surfaces of the gate structure 500 respectively, as illustrated in FIG. 2.

In some embodiments, the semiconductor structure may also include a capacitor contact pad 801. Referring to FIG. 1, an etched bottom A1 of the capacitor contact pad 801 is flush with a top surface of the second interconnect sub-structure 402, and the top surface A2 of the capacitor contact pad 801 is flush with a top surface of the first interconnect sub-structure 401. The gate structure 500 and the interconnect structure 400 may be used to form a part of an SRAM memory cell. The material of the capacitor contact pad 801 may be any one or any combination of W, Cu, Ti, Ni, Al, Co, TiN or metal silicides. The capacitor contact pad 801 can be isolated by the second dielectric layer 300 and the third dielectric layer 201. The second dielectric layer 300 is used to isolate an upper portion of the capacitor contact pad 801, and the third dielectric layer 201 is used to isolate a lower portion of the capacitor contact pad 801. In one example, the etched bottom A1 of the capacitor contact pad 801 can be understood as the bottom of the second dielectric layer 300.

In some embodiments, the gate structure 500 and the interconnect structure 400 form a part of an SRAM memory cell.

According to another embodiment of the present disclosure, a manufacturing method of a semiconductor structure is provided. FIG. 4 to FIG. 8 show schematic process diagrams of the manufacturing method. The manufacturing method of a semiconductor structure includes steps as follows.

Figure 4:
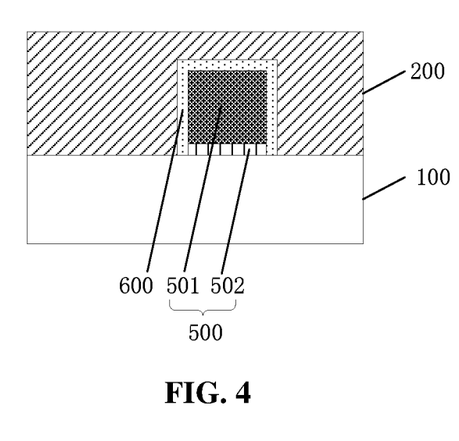
FIG. 4 to FIG. 5 are schematic diagrams showing a formation process of a peripheral region of a semiconductor structure according to an embodiment of the present disclosure.

Referring to FIG. 4, a substrate 100 is provided, and a gate structure 500 and a first dielectric layer 200 are formed on the substrate 100, the first dielectric layer 200 covering the gate structure 500. The material of the substrate 100 may be Silicon (Si), Germanium (Ge), Silicon Germanium (GeSi) or Silicon Carbide (SiC); and the material can also be Silicon-On-Insulator (SOI), Germanium-On-Insulator (GOI); or the material can be other semiconductor materials, such as III-V group compounds such as Gallium Arsenide. The first dielectric layer 200 may be a single-layer structure or a multi-layer stack structure; and the material of the first dielectric layer 200 can be Silicon Oxide, Silicon Nitride, Silicon Oxynitride, FSG (Fluorine-doped Silicon Dioxide), BSG (Boron-doped Silicon Dioxide), PSG (Phosphorus-doped Silicon Dioxide) or BPSG (Boron Phosphorus Doped Silicon Dioxide), low dielectric constant materials, other suitable materials, and/or combinations of the above.

Figure 5:
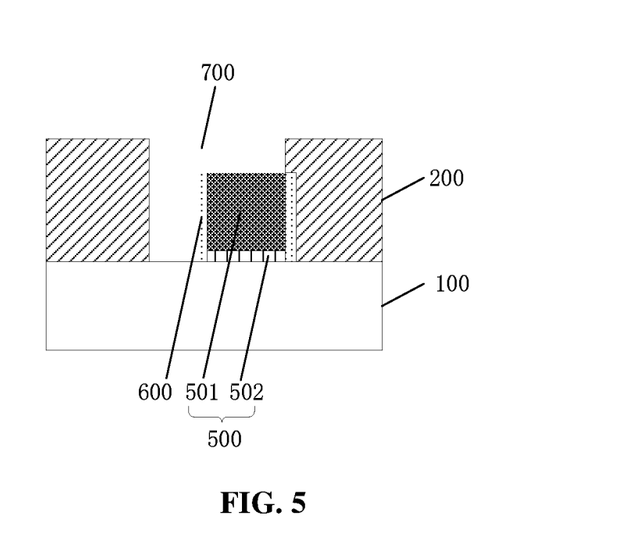

A first opening 700 is formed in the first dielectric layer 200. Referring to FIG. 5, a part of the substrate 100 and at least part of a top of the gate structure 500 are exposed from the first opening 700.

An interconnect structure 400 is formed in the first opening 700. As an example, the following steps can be taken to form the interconnect structure. Referring to the left half of FIG. 6, a conductive layer 800 is formed in the first opening 700, a mask pattern layer is formed on the conductive layer 800, and the mask pattern layer has a first mask pattern 900. Referring to the left half of FIG. 7, the first mask pattern 900 covers at least a part of the conductive layer 800 in the first opening 700; and the conductive layer 800 is etched by using the first mask pattern 900, so that the top surface of the conductive layer 800 on the gate structure 500 is lower than the top surface of the first dielectric layer 200, so as to form the interconnect structure 400. The interconnect structure 400 includes a first interconnect sub-structure 401 and a second interconnect sub-structure 402, the first interconnect sub-structure 401 is connected to the substrate 100, and the second interconnect sub-structure 402 is connected to a top of the gate structure 500.

Figure 7:
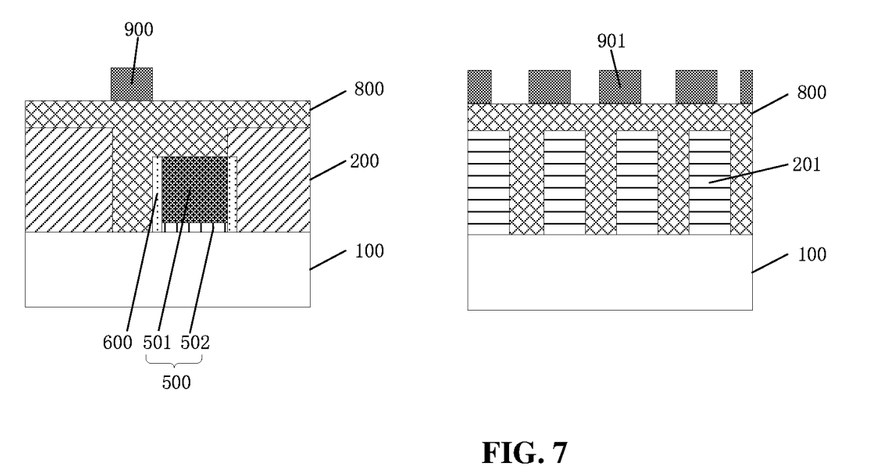

In some embodiments, a projection of the first mask pattern 900 on the substrate 100 coincides with the part of substrate 100 exposed from the first opening 700. The material of the conductive layer 800 includes a conductive material such as tungsten or cobalt.

Figure 6:
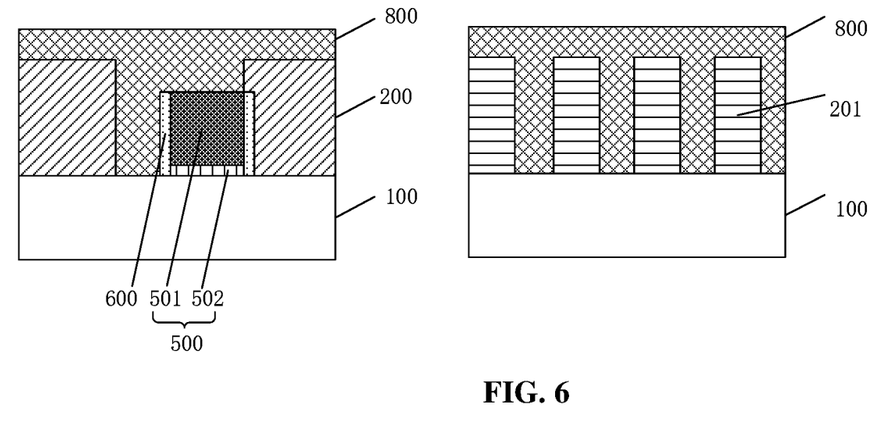
FIG. 6 to FIG. 8 are schematic diagrams showing a formation process of a peripheral region (left half) and a memory region (right half) of a semiconductor structure according to an embodiment of the present disclosure.

In some embodiments, as shown in the right half of FIG. 6, the manufacturing method of a semiconductor structure can also include: a third dielectric layer 201 and a capacitor contact hole in the third dielectric layer 201 are formed on a memory region of the substrate 100, where the conductive layer 800 is also formed in the capacitor contact hole and on the surface of the third dielectric layer 201. The mask pattern layer further has a second mask pattern 901 covering a part of the conductive layer 800 in the capacitor contact hole and a part of the conductive layer 800 on the third dielectric layer 201. The part of the conductive layer 800 in the capacitor contact hole and a part of the third dielectric layer 201 are etched using the second mask pattern 901. Exemplarily, referring to FIG. 7 and FIG. 8, the gate structure 500 is disposed in the peripheral region of the substrate 100, the capacitor contact hole in the third dielectric layer 201 is disposed in the memory region of the substrate 100. The conductive layer 800 is filled into the first opening 700 and the capacitor contact hole, and also covers the surfaces of the first dielectric layer 200 and the third dielectric layer 201.

Figure 8:
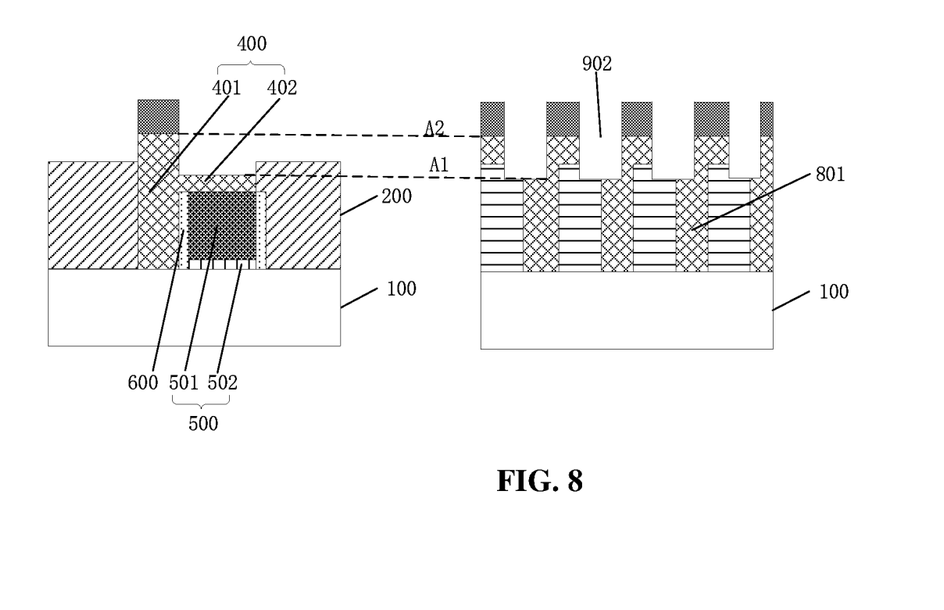

The conductive layer 800 may be processed by the chemical mechanical polishing or an etch-back process, so that the upper surfaces of the conductive layers 800 in the memory region and the peripheral region are made to be on a same level or approximately the same level. The conductive layer 800 in the peripheral region is etched by using the first mask pattern 900, so that the top surface of the conductive layer 800 remaining above the gate structure 500 is lower than the top surface of the first dielectric layer 200. At the same time, the conductive layer 800 and the third dielectric layer 201 in the memory region are etched by using the second mask pattern 901 to form a second opening 902, a part of the bottom of the second opening 902 is disposed in the conductive layer 800, and a part of the bottom of the second opening 902 is disposed in the third dielectric layer 201. The etched bottom A1 is flush with the top surface of the conductive layer 800 remaining above the gate structure 500. That is, the etched bottom A1 is flush with the top surface of the second interconnect sub-structure 402 of the interconnect structure 400. With this arrangement, the process steps can be simplified and the cost can be reduced.

In some embodiments, the manufacturing method of a semiconductor structure may further include: an isolation structure 101 is formed on the substrate 100, where a projection of the gate structure 500 on the substrate 100 at least partially covers the isolation structure 101.

In some embodiments, as shown in FIG. 8 and FIG. 1, a second dielectric layer 300 may also be formed on the first dielectric layer 200 and in the second opening 902; and the second dielectric layer 300 is disposed on the first dielectric layer 200 and covers the second interconnect sub-structure 402. The top surface of the first interconnect sub-structure 401 is flush with the top surface of the second dielectric layer 300.

In some embodiments, SRAM memory cells are manufactured by using the gate structure 500 and the interconnect structure 400.

Embodiments of the present disclosure provide a semiconductor structure and a manufacturing method of a semiconductor structure. The semiconductor structure includes an interconnect structure in contact with the substrate and the gate structure. The interconnect structure of the present disclosure is in contact with the substrate and the gate structure, so that the volume occupied by an interconnect structure can be reduced, the density of the interconnect structures can be increased, and a process window of the interconnect structure can be improved.

It should be understood that the foregoing detailed description of the embodiments of the present disclosure is only used to illustrate or explain the principles of the embodiments of the present disclosure, rather than constitute a limitation to the embodiments of the present disclosure. Therefore, any modifications, equivalent substitutions or improvements made without departing from the spirit and scope of the embodiments of the present disclosure should be included within the protection scope of the embodiments of the present disclosure. Furthermore, the appended claims for embodiments of the present disclosure are intended to cover all changes and modifications that fall within the scope and boundaries of the appended claims, or equivalents of such scope and boundaries.

The steps in methods of embodiments of the present disclosure can be adjusted, combined and deleted sequentially according to actual demand. The modules in device of embodiments of the present disclosure can be combined, divided and deleted according to actual demand.

The invention claimed is:

1. A semiconductor structure, comprising:
   a substrate;
   a gate structure on the substrate, wherein the gate structure comprises a gate dielectric layer and a gate electrode layer; and
   an interconnect structure comprising a first interconnect sub-structure and a second interconnect sub-structure, wherein the second interconnect sub-structure protrudes from the first interconnect sub-structure,
   wherein the first interconnect sub-structure is connected with the substrate and in direct contact with a side surface of the gate electrode layer, and the second interconnect sub-structure is connected with a top of the gate structure and in direct contact with a top surface of the gate electrode layer.

2. The semiconductor structure of claim 1, further comprising:
   an isolation layer disposed on a side surface of the gate structure,
   wherein the first interconnect sub-structure is in direct contact with the isolation layer.

3. The semiconductor structure of claim 1, further comprising:
   a first dielectric layer on the substrate,
   wherein the gate structure and the interconnect structure are disposed in the first dielectric layer, and a top surface of the second interconnect sub-structure is lower than a top surface of the first dielectric layer.

4. The semiconductor structure of claim 3, further comprising:
   a second dielectric layer disposed on the first dielectric layer and covering the second interconnect sub-structure,
   wherein a top surface of the first interconnect sub-structure is flush with a top surface of the second dielectric layer.

5. The semiconductor structure of claim 1, further comprising:
   a capacitor contact pad, wherein an etched bottom of the capacitor contact pad is flush with a top surface of the second interconnect sub-structure, and a top surface of the capacitor contact pad is flush with a top surface of the first interconnect sub-structure.

6. The semiconductor structure of claim 1, wherein the gate structure and the interconnect structure form a part of a memory cell of a Static Random Access Memory (SRAM).

7. The semiconductor structure of claim 1, wherein
   the substrate comprises an isolation structure; and
   a projection of the gate structure on the substrate at least partially covers the isolation structure.

8. A semiconductor structure, comprising:
   a substrate;
   a gate structure on the substrate;
   an interconnect structure comprising a first interconnect sub-structure and a second interconnect sub-structure, wherein the second interconnect sub-structure protrudes from the first interconnect sub-structure; and
   a capacitor contact pad;
   wherein the first interconnect sub-structure is connected with the substrate, and the second interconnect sub-structure is connected with a top of the gate structure, wherein an etched bottom of the capacitor contact pad is flush with a top surface of the second interconnect sub-structure, and a top surface of the capacitor contact pad is flush with a top surface of the first interconnect sub-structure.

* * * * *